United States Patent [19]

Edelman et al.

[11] Patent Number: 4,994,207
[45] Date of Patent: Feb. 19, 1991

[54] THERMOPLASTIC FILM DIE ATTACH ADHESIVES

[75] Inventors: Robert Edelman, Staten Island, N.Y.; Victor D. Papanu, Flemington, N.J.

[73] Assignee: National Starch and Chemcial Investment Holding Corporation, Wilmington, Del.

[21] Appl. No.: 321,472

[22] Filed: Mar. 9, 1989

[51] Int. Cl.$^5$ .............................................. H01B 1/06
[52] U.S. Cl. .................................... 252/514; 524/439
[58] Field of Search .......... 252/514, 512, 518, 62.3 T; 524/439, 440; 528/26, 38, 10; 156/327, 330.9

[56] References Cited

U.S. PATENT DOCUMENTS

| | | | |
|---|---|---|---|
| 4,395,527 | 7/1983 | Berger | 528/26 |
| 4,519,941 | 5/1985 | Anderson | 252/514 |
| 4,557,860 | 12/1985 | DiSalvo et al. | 252/514 |
| 4,604,230 | 8/1986 | Goswami et al. | 252/514 |
| 4,652,398 | 3/1987 | Goswami et al. | 252/514 |
| 4,652,598 | 3/1987 | Edelman | 524/99 |

Primary Examiner—Josephine Barr

[57] ABSTRACT

A die attach adhesive film having excellent die shear strength is provided by a polysiloxaneimide having a weight average molecular weight of at least 100,000 and a aromatic diamine segment with substituents in the meta position.

10 Claims, No Drawings

THERMOPLASTIC FILM DIE ATTACH ADHESIVES

This invention relates to thermoplastic film die attach adhesives and more particularly to ones that require a very short application time for bonding dice to lead frame substrates.

BACKGROUND OF THE INVENTION

In the microelectronics industry there is a need for adhesives that can be processed quickly in addition to having the requisite electrical properties. Currently used die attach adhesives include organic based materials that employ epoxy resins, polyamic acids and polyimides. These are paste-like materials that may or may not contain solvents. All of these materials have significant disadvantages. They all require a bake cycle off-line to either cure the adhesive or remove the solvent. The epoxy resin and polyamic acid based products also crosslink during cure producing significant stress on the die that ultimately may cause die cracking. These materials also have to be refrigerated.

Die attach adhesive based on glyme or other ether solutions of thermoplastic resins, such as, siloxane-modified polyimides were developed to replace the more conventional die attach adhesives that use thermoset resins as a binder. In the fabrication of semiconductor devices, the adhesive is deposited onto the paddle of the lead frame, the die then placed on top of the adhesive and the solvent removed by means of heat. Although solvent-containing poly(siloxaneimide) based systems offer high speed processing, certain problems are encountered. First the rate of solvent evaporation must be carefully controlled. Prior to deposition on the die bond pad, the solvent must be retained by the paste system. Excessive solvent loss, prior to deposition of the die can lead to inadequate adhesion. After paste deposition and die placement, it is desirable to remove the solvent from the adhesive as quickly as possible. This is difficult because the bulk of the paste mass is covered by the die which interferes with the escape of solvent. Solvent retention by the adhesive can cause voids to develop under the die upon exposure to high temperatures which in turn can result in failure during thermal cycling due to localized areas of high stress.

With the advent of increased use of large dice (1"×1" or larger) a die attach adhesive is needed that does not produce excesssive stress on the die because of crosslinking or thermal stress such as that resulting from excessively high cure temperatures. The former is associated with the curing of epoxy resins while both areas of stress buildup are associated with polyamic acid based systems. A solvent containing adhesive also presents problems with large dice because of the difficulty in removing all of the solvent as explained above. Metallic adhesives, such as gold and gold silicon eutectic performs, do not have these problems but still produce significant stress on the die because of the brittle nature of the metallic bond.

It is therefore an object of this invention to provide a die attach adhesive that bonds rapidly without the need for curing or baking off-line and does not produce excess stress on the die.

Another object is to provide an adhesive that need not be refrigerated.

Still another object is an adhesive that provides uniform bond line thickness between the die and paddle.

A further object is to provide an adhesive that can be used at temperatures that do not oxidize copper lead frames or produce excessive thermal stress.

It is also desired that the adhesive can be reworked and can exert adequate adhesion during the processes of wire bonding and molding.

Other objects will become apparent to those skilled in the art upon a further reading of the specification.

SUMMARY OF THE INVENTION

The above enumerated objects have been achieved by an electrically conductive adhesive in film form prepared from a mixture of:

(A) a normally solid thermoplastic polyimide polymeric binder having a weight average molecular weight of at least about 100,000 and synthesized from:

(1) a dianhydride having the structure:

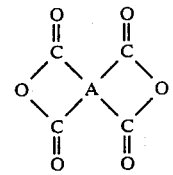

wherein A is a tetravalent residue of benzene, benzophenone, or an aromatic dietherdianhydride having the formula:

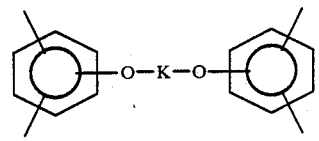

where K is a substituted or unsubstituted group of the formula:

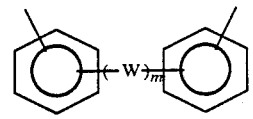

where W is —O—, —S—, —$SO_2$—, linear or branched alkylene or alkenylene having 1 to 8 carbon atoms or —(R)C(L)— where R and L can be the same or different lower alkyls having 1 to 8 carbons or aryl groups having 6 to 24 carbon atoms and m is 0 or 1;

(2) a meta disubstituted benzenediamine having the structure:

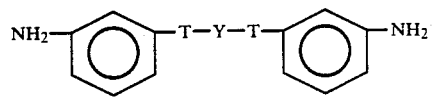

wherein Y is a divalent unsubstituted meta-phenylene radical or a meta-phenylene radical substituted with at least one lower alkyl group containing 1 to about 8 carbon atoms and T is selected from the group consisting of —O—, —S—, —SO—, —$SO_2$—, —CO— and lower alkylene having 1 to about 6 carbon atoms; and (3) and a polysiloxanediamine having the structure:

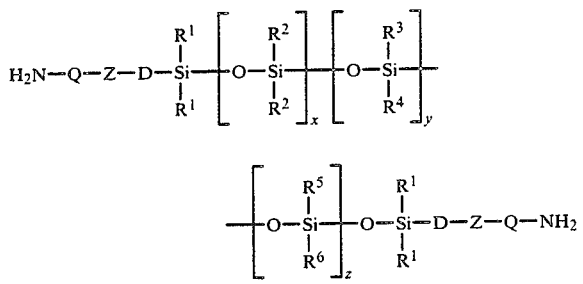

wherein
Q is arylene,
Z is a divalent oxygen, sulfide, sulfone, sulfoxide or carboxylic ester or amide group,
D is a hydrocarbylene group,
$R^1$, $R^2$, $R^3$, $R^4$, $R^5$ and $R^6$ are the same or different alkyls having 1 to 8 carbon, and
x, y and z are integers having values of 0 to 100; and (B) sufficient silver flake to provide a conducting medium, with the proviso that about 20 to about 50 mole percent of the total diamine content is a diamine having the structure of (2).

In a preferred embodiment, the dianhydride is bis[p-(3,4-dicarboxyphenoxy)phenyl] sulfide dianhydride having the structure:

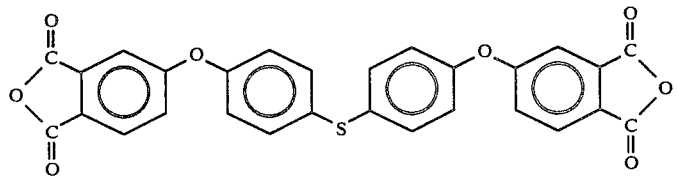

the diamine (2) is bis[1,3(m-aminophenoxy)]benzene and the polysiloxanediamine is bis(m-aminophenoxybutyl)hexadecamethyloctasiloxane having the structure:

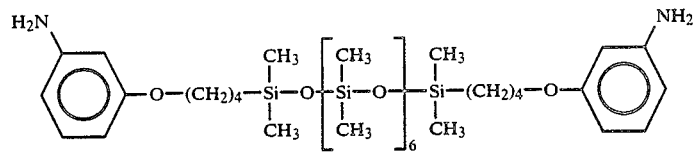

The preferred polyimide composition is derived from about 25 to about 50 parts of meta substituted benzene diamine and about 75 to about 50 parts of polysiloxanediamine per hundred parts by weight of dianhydride. A more preferred range is about 30–40 parts of the former and about 70–60 parts of the latter per hundred parts by weight of dianhydride.

It is also possible to use a mixture of different organic diamines (not containing siloxane moieties) together with different polysiloxanediamines. A preferred conducting amount of silver flakes ranges from about 75 to about 85 parts per hundred parts by weight of the total film composition although lesser and greater ammounts can be used. The particle size of the silver flake is not narrowly critical. As an extension of this invention, a thermally conductive material, such as beryllia, boron nitride, aluminum oxide (single crystal) and the like may be substituted for the silver flake to provide an electrically non-conducting, thermally conducting adhesive film.

Representative dianhydrides include:
4,4'-bis(3,4-di-carboxyphenoxy)diphenyl sulfide dianhydride,
4,'-bis(3,4-di-carboxyphenoxy)diphenyl sulfone dianhydride,
3,3',4,4'-benzophenonetetracarboxylic acid dianhydride,
and the like.

Representative meta substituted benzene diamines include:
2,2-bis[3-(m-aminophenoxy)phenyl] propane having the structure:

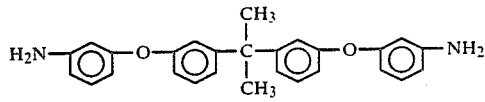

and
2,2-bis[3-(m-aminophenoxy)phenyl] sulfone having the structure:

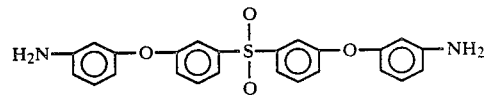

The preparation of the polysiloxanediamines used in this invention is well known in the art. For example, see U.S. Pat. No. 4,395,527 which is incoporated herein by reference. British Pat. No. 1,062,418 also describes useful methods of preparing linear polysiloxanediamines.

It was unexpected that these compositions afford excellent die shear strengths at both room temperature and elevated temperatures of 175° C. This surprising result was achieved by producing polyimides in the weight average molecular weight range of about 100,000 to about 150,000 and by using meta disubstituted benzene diamines in combination with polysiloxanediamines in their synthesis. The invention is further described in the examples which follow. All parts and percentages are by weight unless otherwise specified.

EXAMPLE 1

Preparation of Poly(siloxaneimide)

Into a 12 liter round-bottom flask equipped with a stirrer, thermometer, nitrogen inlet tube, reflux condenser with distillation head attached, modified Dean- Stark moisture trap and heating mantle was charged the following:

5,969 g of monochlorobenzene 49.34 g(0.1656 moles) of 1,3-bis(m-aminophenoxy)benzene (98% pure) available from National Starch and Chemical Corp. washed in with 50 g monochlorobenzene 283.5 g(0.3075 moles) of bis(m-aminophenoxybutyl)hexadecamethyloctasiloxane washed in with 500 g. of monochlorobenzene The reactants were stirred until solution occurred. Then 0.271 g (0.00247 moles) of p-aminophenol (99.46% purity from Rhone Poulenc) was added washed in with 150 g of monochlorobenzene. This was followed by 254 g (0.494 moles, 99.2% purity) of 4,4'-bis(3,4-dicarboxylphenoxy)diphenyl sulfide dianhydride washed in with 600 g of monochlorobenzene. Then 1.5 g of p-toluenesulfonic acid monohydrate was added and washed in with 110 g of monochlorobenzene. The p-aminophenol is present as a chain stopper and in a minor amount such that its effect on the morphology of the final poly(siloxaneimide) is negligible The reaction mixture was heated to reflux in 1-2 hours and 1292 g of monochlorobenzene was removed by distillation. The reaction mixture was refluxed for 10 hours. After cooling the solution was filtered and 1860 g of N-methylpyrrolidone was added and mixed in. The solution was mixed with methanol using 3.5 liters of methanol for every 500 ml. of solution causing precipitation of poly(siloxane)imide. After precipitation, the ethanol was decanted from the precipitate which was washed twice with 8 liters of methanol. The poly(siloxaneimide) was filtered and washed twice with 2 liters of methanol. It was air dried overnight and then dried in a circulating air oven at 50°-60° C. until the polymer solids content were >98.5%. The yield was approxiamtely 500 g. The weight average molecular weight is about 100,000.

EXAMPLE 2

Preparation of Electrically Conductive Polyimide Film Adhesive

The poly(siloxaneimide) prepared in Example 1 was dissolved in diglyme (90° C. for 10 hours) at a 40% solids concentration and filtered. To 116.5 g of the resultant solution was added 115.5 g of silver flake GB 0006 (Chemet Corporation) and 17.25 g of 50-S silver flake (Metz Metallurgical Corporation) and 0.65 g of Dow Corning 1400 Antifoam. These materials were blended in a planetary mixer for one hour.

Film was prepared by a Doctor blade drawdown (9 mil wet thickness) on glass treated with MS-112 fluorcarbon release agent. The film was air dried overnight and removed from the glass by immersion of the coated glass plate into tap water. The film was then dried at 50° C. in a forced air oven for 6 hours. It was then cut into strips to be used as a film die attach adhesive.

EXAMPLE 3

Evaluation of Film Die Attach Adhesive

The film prepared in Example 2 was cut into 0.3"×0.3" pieces. A single piece was placed on the paddle of a copper lead frame. The film and lead frame were placed on the heater block of a Kulicke and Soffa manual die bonder set at 195° C. Immediately, a 250 mil$^2$ die was placed on the film under 175 g pressure for 0.5 seconds using a die collet heated to 45° C. The heating was then continued for 5 seconds after die placement. No scrubbing was done.

The die shear strength measured at room temperature was 21 kg and at 175° C. was 0.5 kg. During the die bonding and testing operations essentially no oxidation of the copper lead frame was detected.

It should be noted that some commerically available thermoplastic conductive die attach adhesive films cause extensive oxidation of the lead frame because they require application temperatures of 300° C. or greater.

CONTROL

Preparation of Low Molecular Weight Poly(siloxaneimide) Film Binder

Into a 3 liter round-bottom flask equipped with a stirrer, thermometer, nitrogen inlet tube, reflux condenser, 2 distillation columns, modified Dean-Stark moisture trap and heating mantle was charged:1,269 g of monochlorobenzene and 71 g of bis(m-aminophenoxybutyl)hexadecamethyloctasiloxane which was washed in with 120 g of monochlorobenzene. Then 12.45 g of 1,3-bis(m-aminophenoxy) benzene was added washed in with 100 g of monochlorobenzene. The reactants were stirred until solution occurred. Then 1.28 g of p-aminophenol was added and washed in with 100 g of monochlorobenzene. This was followed by 63.96 g of 4,4'-bis(3,4-dicarboxyphenoxy)diphenyl sulfide dianhydride washed in with 100 g of monochlorobenzene. Last, 0.365 g of p-toluenesulfonic acid monohydrate was added and washed in with 100 g of monochlorobenzene.

The reaction mixture was heated to reflux in 1-2 hours. Then 315 g of monochlorobenzene was distilled off. The reaction mixture was relfuxed for 10 hours. After cooling, the solution was filtered and 1,889 g of N-methylpyrrolidone was added and mixed in. The solution was then precipitated into methanol using 3.5 liters of methanol for every 500 ml of solution. After precipitation, the methanol as as decanted from the precipitate, which was washed twice with 8 liters of methanol. The polymer was filtered and washed twice with 2 liters of methanol. It was air dried overnight and dried in a circulating air oven at 50°-60° C. until the polymer solids content was >98.5%. The weight average molecular weight is about 40,000-50,000. A larger percentage of p-aminophenol was used in this example than in Example 1 in order to produce a lower molecular weight poly(siloxaneimide).

Comparison of Examples

Film die attach adhesive was prepared as in Example 2 from the poly(siloxaneimide) prepared in Example 4 (Film A) and from a similar material to that made in Examples 1 (Film B) except that 1,3-bis(m-aminophenoxy)benzene was placed by an equal number of moles of 2,2-bis[4-(p-aminophenoxy)phenyl]propane. The evaluation of each film was determined as described in Example 3. The comparative die shear strengths obtained are shown below.

| Test Temperature | Die Shear Strength | |
| --- | --- | --- |
| | A | B |
| 25° C. | — | Die fell off, 0 kg |
| 175° C. | 0.15 kg | Die fell off, 0 kg |

In the above-enumerated examples, the die bonding operations were carried out using a manual die bonder, Model 648-2, manufactured by Kulicke and Soffa Co. of Harsham, Penn.

Die shear data were obtained with a die shear tester, Model M 17503 AJ obtained from Hybrid Machine Products Corp., Canon City, Colo. 81212.

Although the invention has been described with a certain degree of particularity, it is understood that the present disclosure has been made by way of example and that numerous changes can be made without departing from the spirit and scope of the invention.

What is claimed is:

1. Electrically conductive adhesive film comprising a mixture of:

(A) a normally solid thermoplastic polyimide polymeric binder having a weight average molecular weight of about 100,000 to about 150,000 synthesized from:

(1) a dianhydride having the structure:

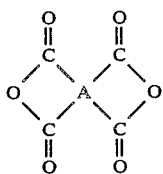

wherein A is a tetravalent residue of benzene, benzophenone, or an aromatic dietherdianhydride having the formula:

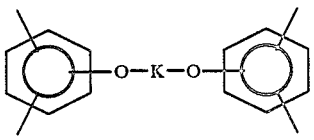

where K is a substituted or unsubstituted group of the formula:

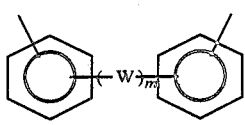

where W is —O—, —S—, —SO$_2$, linear or branched alkylene or alkenylene having 1 to 8 carbons or —(R)C(L)—where R and L can be the same or different lower alkyls having 1 to 8 carbons or aryl groups having 6 to 24 carbon atoms and m is 0 or 1;

(2) a meta disubstituted benzene diamine having the structure:

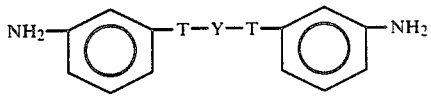

wherein Y is a divalent unsubstituted meta-phenylene radical or a meta-phenylene radical substutited with at least one lower alkyl group containing 1 to about 8 carbon atoms and T is selected from the group consisting of —O—, —S—, —SO—, —SO$_2$—, —CO— and lower alkylene having 1 to about 8 carbon atoms; and (3) a polysiloxanediamine having the structure:

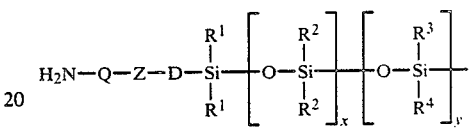

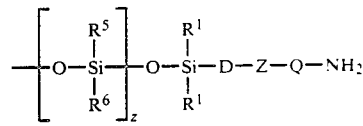

wherein

Q is arylene,

Z is a divalent oxygen, sulfide, sulfone, sulfoxide or carboxylic ester or amide group, D is a hydrocarbylene group, $R^1$, $R^2$, $R^3$, $R^4$, $R^5$ and $R^6$ are the same or different alkyls having 1 to 8 carbons, and x, y and z are integers having values of 0 to 100; and (B) sufficient flake to provide a conducting medium, with the proviso that about 20 to about 50 mole percent of the total diamine content is a diamine having the structure of (2)

2. Film claimed in claim 1 wherein W is —S—.
3. Film claimed in claim 1 wherein W is —O—.
4. Film claimed in claim 1 wherein W is —SO$_2$—.
5. Film claimed in claim 1 wherein T is —S—.
6. Film claimed in claim 1 wherein T is —O—.
7. Film claimed in claim 1 wherein the dianhydride in said polyimide is bis[p-(3,4-dicarboxyphenoxy)phenyl] sulfide dianhydride.
8. Film claimed in claim 1 wherein the meta disubstituted benzene diamine is bis[1,3(m-aminophenoxy)]benzene and the polysiloxanediamine is bis(m-aminophenoxybutyl)hexadecamethyloctasiloxane.
9. Film claimed in claim 1 wherein the polyimide binder contains about 25 to about 50 parts of meta-substituted benzene diamine (2) and about 75 to about 50 parts of polysiloxanediamine per hundred parts by weight of dianhydride.
10. Film claimed in claim 1 wherein the amount of silver flake present is about 75 to about 85 parts of the total film composition.

* * * * *

UNITED STATES PATENT AND TRADEMARK OFFICE
CERTIFICATE OF CORRECTION

PATENT NO. : 4,994,207

DATED : February 19, 1991

INVENTOR(S) : Robert Edelman, Victor D. Papanu

It is certified that error appears in the above-identified patent and that said Letters Patent is hereby corrected as shown below:

On the title page, item [73] "Chemcial" should read "Chemical".

Column 1, line 58, "performs" should read "preforms"
Column 3, line 63, "ammounts" should read "amounts"
Column 4, line 6, "4,'-bis" should read "4,4'-bis"
Column 4, line 26, "
$$\begin{array}{c} O \\ | \\ -S- \\ | \\ O \end{array}$$
" should read "
$$\begin{array}{c} O \\ \| \\ -S- \\ \| \\ O \end{array}$$
"

Column 4, line 41, "incoporated" should read "incorporated"
Column 5, line 31, "ethanol" should read "methanol"
Column 6, line 11, insert "EXAMPLE 4 -" prior to "CONTROL"
Column 6, line 39, "as as" should read "was"
Column 6, line 54, "Examples" should read "Example"
Column 6, line 55, "placed" should read "replaced"
Column 7, line 2, "Harsham" should read "Horsham"

Signed and Sealed this

Twentieth Day of October, 1992

*Attest:*

DOUGLAS B. COMER

*Attesting Officer*   *Acting Commissioner of Patents and Trademarks*